US012772384B2

(12) United States Patent
Usami

(10) Patent No.: US 12,772,384 B2
(45) Date of Patent: Oct. 20, 2026

(54) METHOD FOR MANUFACTURING WIRING SUBSTRATE

(71) Applicant: IBIDEN CO., LTD., Ogaki (JP)

(72) Inventor: Yasushi Usami, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 863 days.

(21) Appl. No.: 18/174,723

(22) Filed: Feb. 27, 2023

(65) Prior Publication Data

US 2023/0276577 A1 Aug. 31, 2023

(30) Foreign Application Priority Data

Feb. 28, 2022 (JP) ................................ 2022-029881

(51) Int. Cl.

| | |
|---|---|
| ***H05K 3/00*** | (2006.01) |
| ***H05K 1/02*** | (2006.01) |
| ***H05K 1/11*** | (2006.01) |
| ***H05K 1/14*** | (2006.01) |
| ***H05K 3/20*** | (2006.01) |

(Continued)

(52) U.S. Cl.

CPC ......... *H05K 3/0061* (2013.01); *H05K 1/0269* (2013.01); *H05K 1/111* (2013.01); *H05K 1/14* (2013.01); *H05K 3/007* (2013.01); *H05K 3/202* (2013.01); *H05K 3/3465* (2026.01); *H05K 1/0268* (2013.01); *H05K 3/4038* (2013.01); *H05K 2203/162* (2013.01)

(58) Field of Classification Search

CPC ................. H05K 3/0061; H05K 3/007; H05K 2203/162; H05K 1/0269; H05K 1/111; H05K 1/14; H05K 3/202; H05K 1/0268; H05K 3/3465; H05K 3/4038

See application file for complete search history.

(56) References Cited

U.S. PATENT DOCUMENTS

2019/0335594 A1* 10/2019 Matsuura ............... H05K 3/007
2020/0141978 A1* 5/2020 Ishimatsu ........... H05K 3/4038

FOREIGN PATENT DOCUMENTS

JP 2017-011092 A 1/2017
JP 2018018968 A * 2/2018

OTHER PUBLICATIONS

Kuczynski et al, "Thermally conductive dielectrics for insulated metal core cards", Materials Science and Engineering B45, pp. 59-68, May 1996. (Year: 1996).*

* cited by examiner

*Primary Examiner* — A. Dexter Tugbang
(74) *Attorney, Agent, or Firm* — Finnegan, Henderson, Farabow, Garrett & Dunner, LLP

(57) ABSTRACT

A method for manufacturing a wiring substrate includes preparing a first support plate having a metal foil formed on surface of a support substrate, forming a wiring substrate on the foil such that the wiring substrate has first surface facing the foil, attaching a second support plate to second surface of the wiring substrate, and separating the support substrate from the foil after attaching the second support plate such that the foil is removed from the first surface and that the first surface is exposed. The wiring substrate has first conductor pads on the first surface, and second conductor pads on the second surface, and the method includes conducting first inspection such that conduction between the second pads is inspected before attaching the second plate to the second surface, and conducting second inspection such that conduction between the first pads is inspected after removing the foil from the first surface.

20 Claims, 3 Drawing Sheets

(51) Int. Cl.

| | |
|---|---|
| ***H05K 3/3465*** | (2026.01) |
| ***H05K 3/40*** | (2006.01) |

METHOD FOR MANUFACTURING WIRING SUBSTRATE

CROSS-REFERENCE TO RELATED APPLICATIONS

The present application is based upon and claims the benefit of priority to Japanese Patent Application No. 2022-029881, filed Feb. 28, 2022, the entire contents of which are incorporated herein by reference.

BACKGROUND OF THE INVENTION

Field of the Invention

The present invention relates to a method for manufacturing a wiring substrate.

Description of Background Art

Japanese Patent Application Laid-Open Publication No. 2017-11092 describes a conduction inspection method for a printed wiring board having a buildup layer. The entire contents of this publication are incorporated herein by reference.

SUMMARY OF THE INVENTION

According to one aspect of the present invention, a method for manufacturing a wiring substrate includes preparing a first support plate having a metal foil formed on a surface of a support substrate, forming a wiring substrate on the metal foil of the first support plate such that the wiring substrate has a first surface facing the metal foil of the first support plate, attaching a second support plate to a second surface of the wiring substrate on the opposite side with respect to the first surface, and separating the support substrate from the metal foil of the first support plate after the attaching of the second support plate such that the metal foil of the first support plate is removed from the first surface of the wiring substrate and that the first surface of the wiring substrate is exposed. The wiring substrate has first conductor pads formed on the first surface, and second conductor pads formed on the second surface, and the method for manufacturing the wiring substrate includes conducting a first conduction inspection such that conduction between the second conductor pads is inspected before the attaching of the second support plate to the second surface of the wiring substrate, and conducting a second conduction inspection such that conduction between the first conductor pads is inspected after the removing of the metal foil from the first surface of the wiring substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
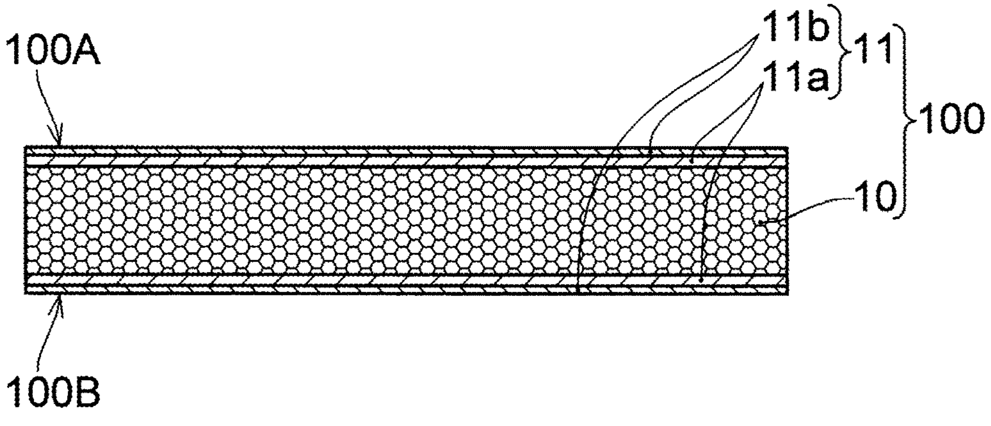
FIG. 1A illustrates an example of a method for manufacturing a wiring substrate according to an embodiment of the present invention.

Embodiments will now be described with reference to the accompanying drawings, wherein like reference numerals designate corresponding or identical elements throughout the various drawings.

A method for manufacturing a wiring substrate according to an embodiment of the present invention is described with reference to the drawings. First, as illustrated in FIG. 1A, a support plate (first support plate) 100 is prepared in which a metal foil 11 is provided on a surface of a support substrate 10. For the support substrate 10, for example, a prepreg formed by impregnating a core material such as a glass fiber with a resin material such as an epoxy resin can be used. In the illustrated example, the metal foil 11 includes a metal foil layer (11*b*) as a first layer, and a carrier metal foil layer (11*a*) as a second layer.

A surface of the carrier metal foil layer (11*a*) on an opposite side with respect to the metal foil layer (11*b*) is bonded to a surface of the support substrate 10 by thermo-compression bonding or the like. The metal foil layer (11*b*) and the carrier metal foil layer (11*a*) are adhered to each other, for example, with a separable adhesive such as a thermoplastic adhesive. That is, the metal foil 11 has a structure including two layers, a first layer (carrier metal foil layer) (11*a*) and a second layer (metal foil layer) (11*b*), which are separable from each other. The metal foil layer (11*b*) and the carrier metal foil layer (11*a*) may be adhered to each other only near an outer periphery thereof in an extension direction (planar direction) in a plan view.

As the first support plate 100, a double-sided copper-clad laminated plate may be used. As the metal foil layer (11*b*) and the carrier metal foil layer (11*a*) that form the metal foil 11, copper foils are preferably used. However, without being limited to this, other metal foils such as nickel foils may also be used. In the example illustrated in FIG. 1A, the metal foil 11 is provided on both a surface (100A) on one side of the first support plate 100 and a surface (100B) on an opposite side with respect to the surface (100A). Wiring substrates to be manufactured can be simultaneously formed on the metal foil 11 that forms the surface (100A) on one side of the first support plate 100 and on the metal foil 11 that forms the surface (100B) on the other side of the first support plate 100. However, it is not always necessary to provide the metal foil 11 on both the front and back sides of the support plate 100. It is also possible that a wiring substrate is manufactured only on the metal foil 11 that forms the surface on one side of the first support plate 100.

In the following description referring to FIG. 1B and subsequent figures, illustration and description of the surface (100B) side of the first support plate 100 are omitted. Therefore, in FIGS. 1B-1G, only the structural elements of the wiring substrate formed on the surface (100A) side of the first support plate 100 are illustrated. However, wiring substrates may be respectively formed on the surface (100A) side and the surface (100B) side of the first support plate 100.

In the description of the method for manufacturing a wiring substrate of the present embodiment, a side farther from the support substrate 10 of first support plate 100 is referred to as "upper," "upper side," "outer side," or "outer," and a side closer to the support substrate 10 is referred to as "lower," "lower side," "inner side," or "inner." Further, for each structural element, a surface facing an opposite side with respect to the support substrate 10 is also referred to as an "upper surface," and a surface facing the support substrate 10 is also referred to as a "lower surface." Therefore, in the description of each element formed on an upper side of the metal foil 11, a side farther from the first support plate 100 is also referred to as an "upper side," "upper layer side," or "outer side," or simply "upper" or "outer," and a side closer to the first support plate 100 is also referred to as a "lower side," "lower layer side," or "inner side," or simply "lower" or "inner."

Figure 1B:
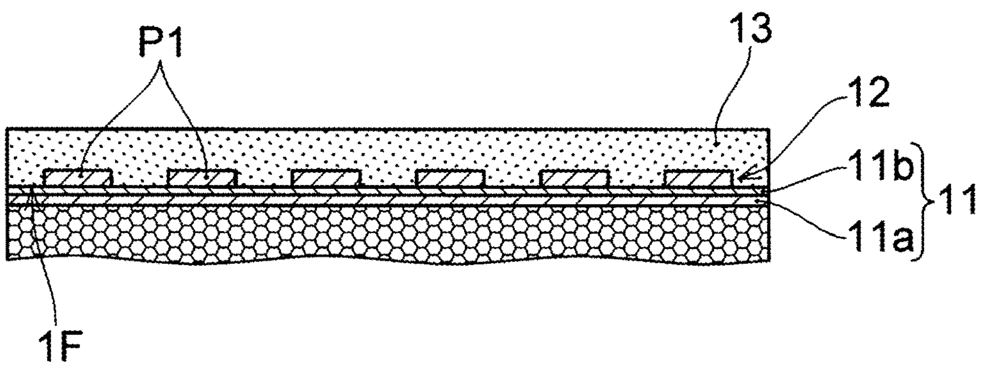
FIG. 1B illustrates an example of a method for manufacturing a wiring substrate according to an embodiment of the present invention.

Next, as illustrated in FIG. 1B, a conductor layer 12 and an insulating layer 13 that form a surface of the wiring substrate to be manufactured is formed on the metal foil 11. In forming the conductor layer 12 on the metal foil 11, first, a plating resist for forming the conductor layer 12 is formed on the metal foil 11. In the plating resist, openings are formed, for example, by photolithography, in regions corresponding to conductor patterns of the conductor layer 12 to be formed. Then, by electrolytic plating using the metal foil 11 as a seed layer, an electrolytic plating film is formed in the openings of the plating resist. As a result, the conductor layer 12 including predetermined conductor patterns formed of the electrolytic plating film in the openings is formed on the metal foil 11.

The conductor layer 12 formed on the metal foil 11 is formed to have patterns including multiple conductor pads (P1) as illustrated. After the formation of the conductor layer 12, the plating resist is removed and the insulating layer 13 is coated on the conductor layer 12 and on the metal foil 11 exposed from the conductor patterns of the conductor layer 12. The insulating layer 13 can be formed, for example, by thermocompression bonding a film-like epoxy resin or the like onto the conductor layer 12 and the exposed portions of metal foil 11. The state illustrated in FIG. 1B is formed.

By forming the conductor layer 12 and the insulating layer 13 on the metal foil 11 as illustrated, a first surface (1F) on one side of the wiring substrate to be manufactured is formed. All the multiple conductor pads (P1) included in the conductor layer 12 that forms the first surface (1F) are short-circuited by the metal foil 11.

Figure 1C:
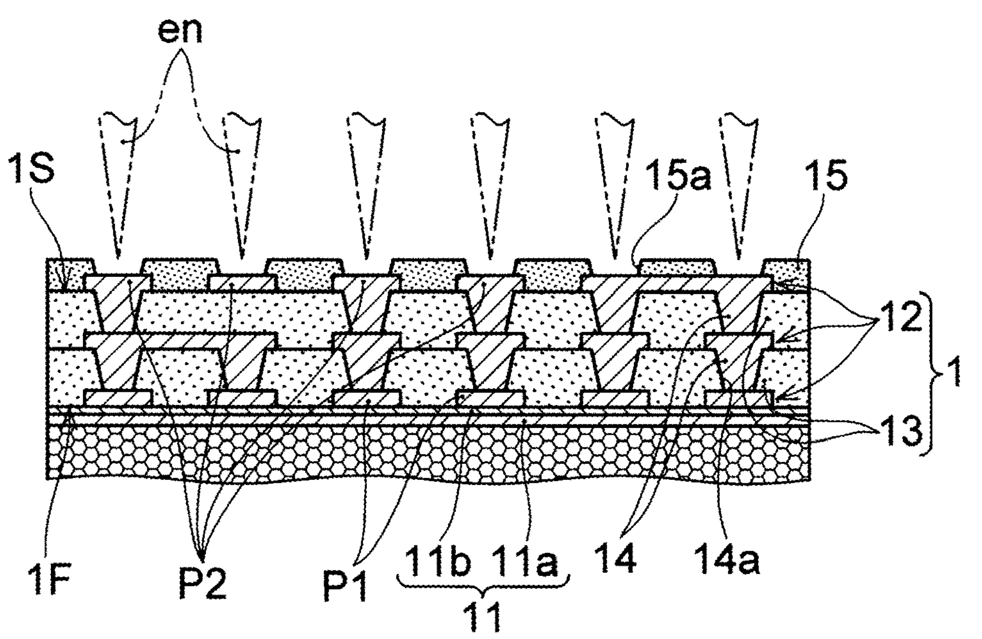
FIG. 1C illustrates an example of a method for manufacturing a wiring substrate according to an embodiment of the present invention.

Next, as illustrated in FIG. 1C, via conductors 14 penetrating the insulating layer 13 that forms the first surface (1F) are formed, and further, by repeating the lamination of the conductor layer 12 and the insulating layer 13 and the formation of the via conductors 14, a wiring substrate 1 is formed. The via conductors 14 formed in each insulating layer 13 are formed to penetrate the insulating layer 13 and connect the conductor layers 12 formed on both sides of the insulating layer 13. In the formation of the via conductors 14, first, conduction holes (14*a*) penetrating an insulating layer 13 are formed at places where the via conductors 14 of the insulating layer 13 are to be formed by irradiating, for example, CO2 laser from the upper side of the insulating layer 13. Subsequently, a metal layer is formed by electroless plating or sputtering in the conduction holes (14*a*) and on the upper surface of the insulating layer 13, and the via conductors 14 and the conductor layer 12 are integrally formed by electrolytic plating using the metal layer as a seed layer.

Specifically, the electrolytic plating film can be formed using a so-called pattern plating method or the like using a plating resist that has predetermined openings at formation regions of the conductor patterns the conductor layer 12 and at positions of the conduction holes (14*a*). After the formation of the electrolytic plating film described above, the resist is removed. Then, a portion of the metal layer (seed layer) that is exposed by the removal of the plating resist and is not covered by the electrolytic plating film is removed by etching. As a result, the via conductors 14 and the conductor layer 12, each having a two-layer structure, can be integrally formed by the metal layer and the electrolytic plating film in the conduction holes (14*a*) and on the insulating layer 13. In the illustration, the metal layer and electrolytic plating film that form the via conductors 14 and the conductor layer 12 are simplified and are each illustrated as a single layer.

The lamination of the insulating layer 13 and the formation of the via conductors 14 and the conductor layer 12 are repeated according to the number of the insulating layers 13 and the number of the conductor layers 12 included in the wiring substrate to be manufactured. In the illustrated example, the wiring substrate 1 to be manufactured includes two insulating layers 13 and three conductor layers 12. However, the number of the insulating layers and the number of the conductor layers included in the wiring substrate to be manufactured are not limited to those illustrated in the drawing. The number of times of the process for laminating the insulating layers 13 and the conductor layers 12 can be increased or decreased as appropriate.

The wiring substrate 1 is formed such that the conductor layer 12 that forms an uppermost surface of the wiring substrate 1 (a surface on an opposite side with respect to the first surface (1F) facing the metal foil 11) includes multiple conductor pads (P2). The surface of the wiring substrate 1 that includes the multiple conductor pads (P2) is referred to as a second surface (1S). In the wiring substrate 1 in the illustrated example, two of the multiple (six) second conductor pads (P2) near a center are formed to be electrically connected to different first conductor pads (P1) via different conductor paths formed by the conductor layers 12 and the via conductors 14.

A material of the conductor layers 12 and the via conductors 14 of the wiring substrate 1 is not particularly limited as long as the material has a good conductivity and facilitates easy formation by plating. Examples of the material of the conductor layers 12 and the via conductors 14 include copper and nickel, and copper is preferably used. A material of the insulating layers 13 is not particularly limited as long as the material has a good insulating property. In addition to an epoxy resin described above, a bismaleimide triazine resin (BT resin), a phenol resin and the like may be used. The resin material forming the insulating layers 13 may contain a reinforcing material (core material) such as a glass fiber and/or inorganic filler such as silica.

On the second surface (1S) of the wiring substrate 1, as illustrated, a solder resist layer 15 having openings (15*a*) on the second conductor pads (P2) is formed. The solder resist layer 15 is formed on the upper surface of the insulating layer 13 exposed without being covered by the conductor layer 12 of the second surface (1S) of the wiring substrate 1, and on outer edges of the conductor pads (P2). For example, a layer formed of a photosensitive epoxy resin is formed on the conductor layer 12 and on the insulating layer 13 by printing or spray coating or the like, and the openings (15*a*) are formed by photolithography. The state of FIG. 1C is formed.

Subsequently, in the state illustrated in FIG. 1C, a conduction inspection of the wiring substrate 1 is performed. Specifically, via the multiple second conductor pads (P2) exposed from the openings (15*a*), a conduction inspection of conductor paths (conductor circuits) formed by the conductors (the conductor layers 12 and the via conductors 14) of the wiring substrate 1 is performed. In the present specification, the term "conduction inspection" means to inspect presence or absence of an open defect and/or a short-circuit defect in conductor circuits that electrically connect between conductor pads exposed on a surface of the wiring substrate 1.

An inspection device commonly referred to as an open-short checker may be used for a conduction inspection. The open-short checker has multiple contact terminals and can measure a conduction resistance value of a conductor circuit connected via a pair of contact terminals among the multiple contact terminals. By comparing a detected conduction resistance value with a predetermined resistance value, presence or absence of an open defect or a short-circuit defect can be inspected. Each of the multiple contact terminals (en) of the inspection device is in contact with an exposed surface of a second conductor pad (P2), and a resistance value between any conductor pads (P2) is measured.

By inspecting whether or not a resistance value between conductor pads (P2) to be measured is within a predetermined range, presence or absence of a defect in a conductor circuit between the conductor pads (P2) can be determined.

In the state illustrated in FIG. 1C, all the multiple first conductor pads (P1) that form the first surface (1F) are connected to the conductive metal foil 11. That is, the multiple first conductor pads (P1) are short-circuited by the metal foil 11. Therefore, a state is achieved in which an open check between second conductor pads (P2) that are respectively electrically connected to different first conductor pads (P1) is possible.

In particular, specifically, of the multiple (six) second conductor pads (P2) illustrated, the two near the center are respectively connected to different first conductor pads (P1) by different conductor paths. When a conductor circuit connecting these two second conductor pads (P2) near the center and the first conductor pads (P1) is open, such as when the conductor circuit is disconnected, a resistance value between the second conductor pads (P2) shows a very large value compared to that when the conductor circuit is not open. Therefore, it is possible to inspect an open defect in a conductor circuit (open inspection) based on a resistance value obtained by a measurement. In this way, in the method for manufacturing the wiring substrate of the present embodiment, an open inspection is possible even in a conductor circuit connecting the second conductor pads (P2) and the first conductor pads (P1), for which an open inspection cannot be performed when short-circuited by the metal foil 11.

A conduction inspection between the multiple second conductor pads (P2) performed in the state illustrated in FIG. 1C is referred to as a first conduction inspection. The first continuity test is performed in a state in which the wiring substrate 1 supported by the first support plate 100. Therefore, the first conduction inspection can be performed in a state in which flatness of the wiring substrate 1 is relatively well maintained. It is thought that the contact between the contact terminals (en) and the second conductor pads (P2) can be made more reliable and a more reliable conduction inspection can be performed. A wiring substrate in which an open defect or a short-circuit defect has been detected by the first conduction inspection is collected as a defective product.

Figure 1D:
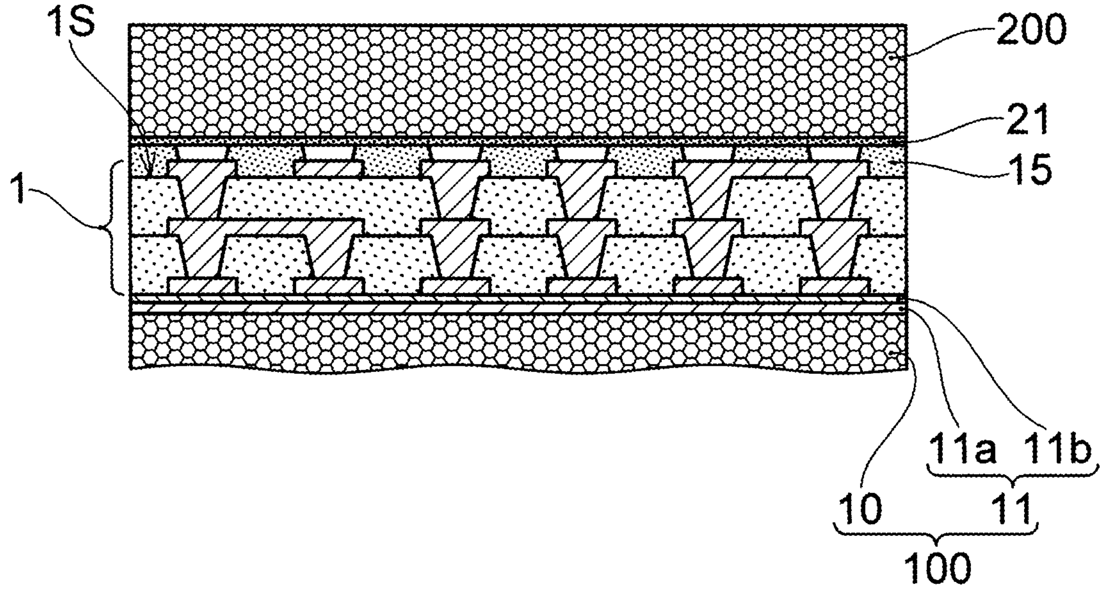
FIG. 1D illustrates an example of a method for manufacturing a wiring substrate according to an embodiment of the present invention.

For a wiring substrate that has been determined as a non-defective product by the first conduction inspection, the following subsequent process is further performed. As illustrated in FIG. 1D, a second support plate 200 is positioned on the wiring substrate 1 on a side opposite with respect to the side where the first support plate 100 is provided. Specifically, the second support plate 200 formed of a material having an appropriate rigidity is attached via an adhesive layer 21 to an upper surface of the solder resist layer 15 formed on the second surface (1S) of the wiring substrate 1.

For the second support plate 200, for example, a glass epoxy plate or the like formed by impregnating a reinforcing material such as a glass fiber with an epoxy resin is used. However, in addition to this, any material having an appropriate rigidity may be used. A plate-like body formed of glass, metal, or ceramics may be used. The adhesive layer 21 having appropriate adhesiveness (adhesion) with respect to the solder resist layer 15 is provided between the second support plate 200 and the solder resist layer 15, and the support plate 200 and the solder resist layer 15 are bonded together by the adhesiveness of the adhesive layer 21.

A material that forms the adhesive layer 21 is not particularly limited as long as the material can tightly adhere to the support plate 200 and the solder resist layer 15. At least, a material that can exhibit a stronger adhesive force with respect to the support plate 200 than with respect to the solder resist layer 15 is preferable as the material of the adhesive layer 21. The material that forms the adhesive layer 21 may be a material that loses adhesiveness with respect to the solder resist layer 15 due to a specific treatment such as ultraviolet irradiation or heating. For example, an acrylic resin may be used as the material of the adhesive layer 21.

Figure 1E:
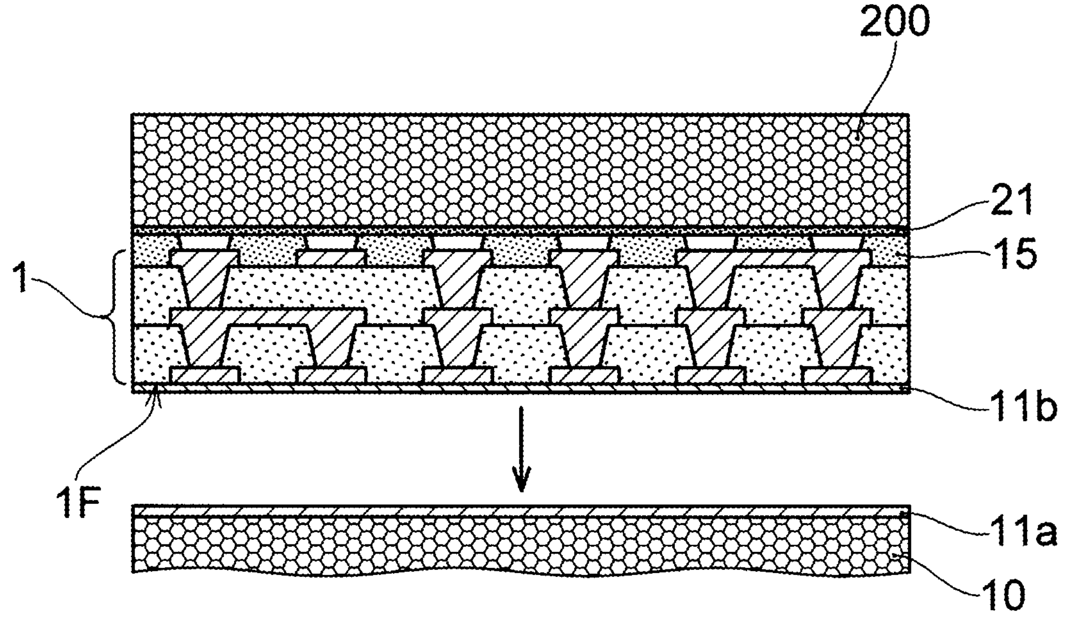
FIG. 1E illustrates an example of a method for manufacturing a wiring substrate according to an embodiment of the present invention.

Next, as illustrated in FIG. 1E, in a state in which the second support plate 200 is connected to the wiring substrate 1 via the adhesive layer 21 and the solder resist layer 15, the first support plate 100 and the wiring substrate 1 are separated from each other and the first support plate 100 is removed. That is, the separation and the removal of the first support plate 100 are performed in a state in which the wiring substrate 1 is supported by the second support plate 200. Specifically, the carrier metal foil layer (11*a*), which is bonded to the support substrate 10, and the metal foil layer (11*b*) are separated from each other. That is, the support substrate 10 and the carrier metal foil layer (11*a*) are integrally separated from the metal foil layer (11*b*) so that the metal foil layer (11*b*) remains adhered to the first surface (1S) of the wiring substrate 1.

In separating the metal foil layer (11*b*) and the carrier metal foil layer (11*a*) from each other, for example, the thermoplastic adhesive bonding the metal foil layer (11*b*) and the carrier metal foil layer (11*a*) is softened by heating, and, in this state, the metal foil layer (11*b*) and the carrier metal foil layer (11*a*) are pulled apart from each other. When the metal foil layer (11*b*) and the carrier metal foil layer (11*a*) are adhered to each other only in an outer peripheral portion, the metal foil layer (11*b*) and the carrier metal foil layer (11*a*) may be cut on an inner peripheral side of the adhering portion so that the adhering portion is removed. It is also possible to separate the metal foil layer (11*b*) and the carrier metal foil layer (11*a*) from each other by simply pulling the first support plate 100 and the second support plate 200 in mutually opposite directions. As illustrated in FIG. 1E, by the separation of the carrier metal foil layer (11*a*) and the metal foil layer (11*b*) from each other, the metal foil layer (11*b*) is exposed on a lower surface side of the wiring substrate 1.

Figure 1F:
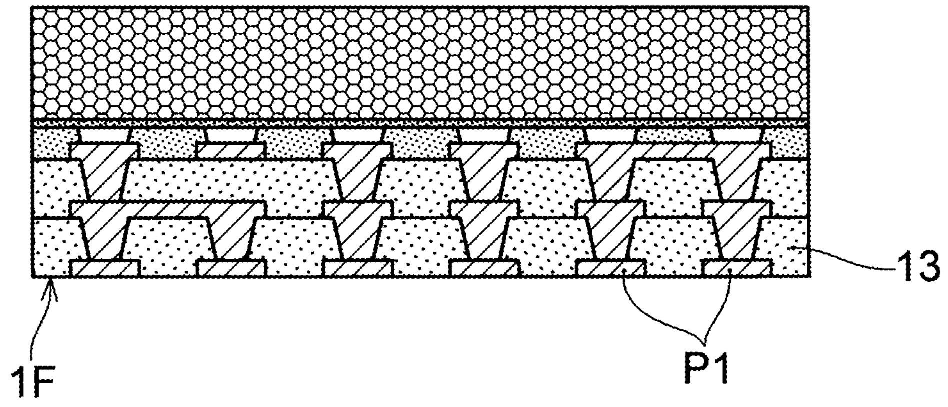
FIG. 1F illustrates an example of a method for manufacturing a wiring substrate according to an embodiment of the present invention.

Next, the metal foil layer (11*b*) exposed by being separated from the carrier metal foil layer (11*a*) is removed by etching. As illustrated in FIG. 1F, by the removal of the metal foil layer (11*b*), the first surface (1F) of the wiring substrate 1 is exposed. The multiple first conductor pads (P1) that are mutually short-circuited by the metal foil layer (11*b*) are electrically separated from each other by the removal of the metal foil layer (11*b*). Surfaces of the first conductor pads (P1) that are not covered by the insulating layer 13 are exposed.

Figure 1G:
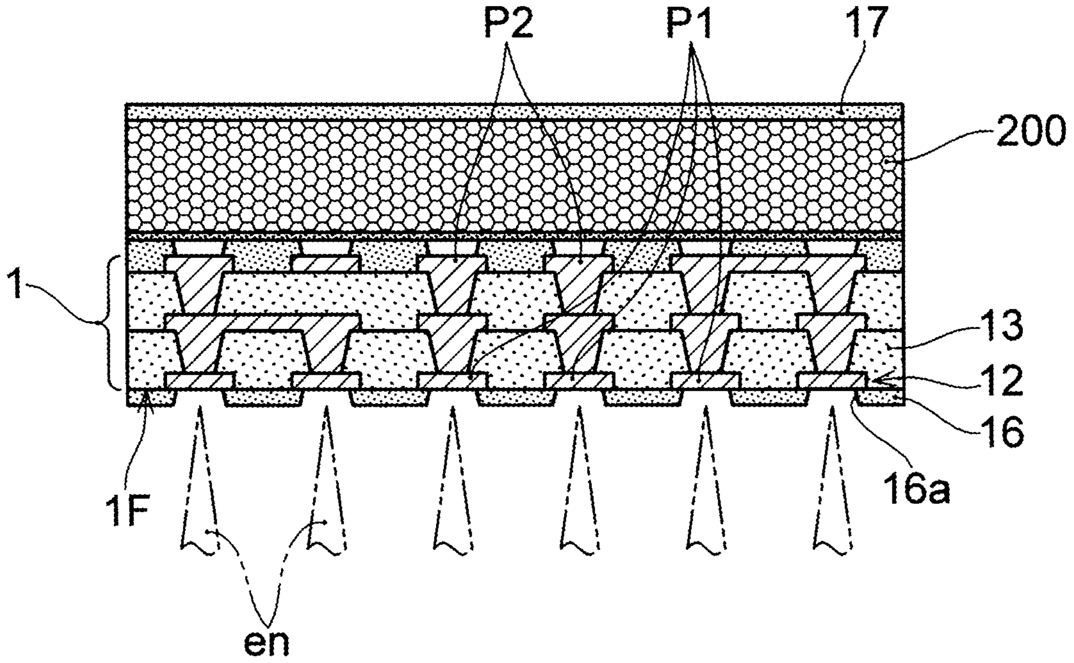
FIG. 1G illustrates an example of a method for manufacturing a wiring substrate according to an embodiment of the present invention.

Next, as illustrated in FIG. 1G, on the exposed first surface (1F) of the wiring substrate 1, a solder resist layer 16 having openings (16*a*) exposing the first conductor pads (P1) is formed. For example, a layer formed of a photosensitive epoxy resin is formed by printing or spray coating to cover lower surfaces of the conductor layer 12, which includes the multiple first conductor pads (P1), and the insulating layer 13, and the openings (16*a*) are formed by photolithography. At the same time as the formation of the solder resist layer 16 on the first surface (1F) side, a solder resist layer 17 can also be formed as a solid layer on a surface of the second support plate 200 on an opposite side with respect to a surface facing the wiring substrate 1.

When an external electronic component is mounted on the wiring substrate 1, in FIG. 1G, the electronic component can be mounted on a surface of the wiring substrate 1 on the first surface (1F) side where the first conductor pads (P1) are exposed. Therefore, the surface of the wiring substrate 1 where the first conductor pads (P1) are exposed can be a component mounting surface on which an external electronic component can be mounted. In using the wiring substrate 1, the first conductor pads (P1) can be electrically connected to connection pads of an electronic component via connection members (such as solders) having an appropriate conductivity. Further, when the wiring substrate 1 itself is mounted on an external element such as an external wiring substrate (for example, a motherboard of any electrical device), a surface of the wiring substrate 1 on a side where the second support plate 200 is attached and the second conductor pads (P2) are provided in the drawing can be a connection surface connected to the external element. In using the wiring substrate 1, the second conductor pads (P2) can be connected to any substrate, electrical component, or mechanical component, or the like.

Subsequently, in the state illustrated in FIG. 1G, a conduction inspection of conductor circuits forming the wiring substrate 1 is performed. Similar to the first conduction inspection described above, the inspection device commonly referred to as an open-short checker may be used. The conduction inspection performed in the state illustrated in FIG. 1G is referred to as a second conduction inspection.

In the second conduction inspection, presence or absence of an open defect or a short-circuit defect can be inspected by measuring a conduction resistance value between the multiple first conductor pads (P1) that form the first surface (1F). The contact terminals (en) of the inspection device are connected to exposed surfaces of the multiple first conductor pads (P1), and, for example, a resistance value between any pair of first conductor pads (P1) is measured. When a measured resistance value is not within a predetermined range, it can be determined that there is a defect.

By separating the first support plate 100 and removing the metal foil layer (11*b*) illustrated in FIGS. 1E and 1F, the multiple first conductor pads (P1) are electrically separated from each other. Among the multiple (six) first conductor pads (P1) illustrated in FIG. 1G, the two first conductor pads (P1) near the center are completely electrically separated from each other without being connected by the conductor paths (the conductor layers 12 and the via conductors 14) of the wiring substrate 1. In the second conduction inspection, in particular, presence or absence of a short-circuit defect between these first conductor pads (P1), which are to be completely electrically separated from each other, can be inspected (short-circuit inspection).

Specifically, for example, contact terminals (en) are respectively connected to a pair of first conductor pads (P1) that are to be electrically separated from each other, and a resistance value between the pair of first conductor pads (P1) is measured. When there is a short circuit between the pair of first conductor pads (P1), the resistance value between the corresponding contact terminals (en) shows a very low value. As a result, a short-circuit defect between the first conductor pads (P1) that are to be completely electrically separated from each other can be detected.

The second conduction inspection between the multiple first conductor pads (P1) in the state illustrated in FIG. 1G is performed in a state in which the wiring substrate 1 is supported by the second support plate 200. Therefore, the second conduction inspection can be performed in a state in which the flatness of the wiring substrate 1 is well maintained. It is thought that the contact between the contact terminals (en) and the first conductor pads (P1) can be made more reliable and a more reliable conduction inspection can be performed. A wiring substrate in which an open defect or a short-circuit defect has been detected by the second conduction inspection is collected as a defective product. By completing the second conduction inspection, the manufacture of the wiring substrate is completed. The support plate 200 can be removed from the wiring substrate 1 at an appropriate timing as needed in using the wiring substrate 1.

In the manufacturing method described using the manufacture of the wiring substrate 1 as an example, in the second conduction inspection, a short-circuit inspection between the first conductor pads (P1) that are to be electrically separated from each other can be performed. Further, in the first conduction inspection, an open inspection between the second conductor pads (P2) that are connected to different first conductor pads (P1) via mutually different conductor paths can be performed. In particular, for the conductor paths for which an open inspection is not possible in the second conduction inspection illustrated in FIG. 1G (the paths connecting the first conductor pads (P1) and the second conductor pads (P2) by mutually different conductor paths), an open inspection can be performed in the first conduction inspection. It is thought that an inspection of a defect in the conductor circuits of the wiring substrate 1 can be more reliably performed.

A wiring substrate manufactured using the manufacturing method of the embodiment is not limited to a wiring substrate having the structure of the illustrated wiring substrate 1, and a wiring substrate having the structure, shape, and material exemplified in the present specification. On each the exposed surfaces of the conductor pads (the first and second conductor pads) of the wiring substrate, for example, multiple metal plating films or a single metal plating film such as Ni/Au, Ni/Pd/Au, or Sn, and a protective film, which may be an OSP film, may be formed. The wiring substrate 1 can have any number of conductor layers and any number of insulating layers. A conductor pattern of each of the conductor layers can be formed in any pattern.

A method of manufacturing a wiring substrate according to an embodiment of the present invention is not limited to the method described with reference to FIGS. 1A-1G. In a method for manufacturing a wiring substrate according to an embodiment of the present invention, the first conduction inspection may be performed in the state in which the first support plate is attached to the wiring substrate, and the second conduction inspection may be performed after the second support plate and the metal foil are removed, and any process may be added in addition to the processes described above, or any part of the processes described above may be omitted. It is also possible that the second conduction inspection is performed before the solder resist layer is formed on the first surface.

Japanese Patent Application Laid-Open Publication No. 2017-11092 describes a conduction inspection method for a printed wiring board having a buildup layer. The build-up layer has multiple mounting pads on a surface on one side thereof, and a resin layer is provided on a surface on the other side of the build-up layer. Wirings in the buildup layer that are respectively electrically connected to the multiple mounting pads are electrically connected via internal conductor members penetrating the resin layer and a copper foil provided on a surface of the resin layer. A short-circuit defect of the wirings in the build-up layer is determined by measuring a resistance value between the multiple mounting pads.

In the conduction inspection method of the printed wiring board of Japanese Patent Application Laid-Open Publication No. 2017-11092, the conduction inspection is performed between the multiple mounting pads formed on the surface on one side of the buildup layer, and no conduction inspection is performed between conductor layers (conductor pads) on the surface on the other side. It is thought that detection of a conduction defect in the wirings in the buildup layer may be insufficient.

A method for manufacturing a wiring substrate according to an embodiment of the present invention includes: preparing a first support plate in which a metal foil is provided on a surface of a support substrate; forming, on the metal foil, a wiring substrate that has a first surface and a second surface on an opposite side with respect to the first surface, the first surface facing the metal foil; attaching a second support plate to the second surface of the wiring substrate; and, after the attaching of the second support plate, exposing the first surface by separating the support substrate from the metal foil and removing the metal foil from the first surface. The first surface includes multiple first conductor pads. The second surface includes multiple second conductor pads. Before the attaching of the second support plate to the second surface, a first conduction inspection between the multiple second conductor pads is performed. After the removing of the metal foil from the first surface, a second conduction inspection between the first conductor pads is performed.

According to an embodiment of the present invention, the inspection is performed between the multiple second conductor pads provided on the surface (the second surface) on one side of the wiring substrate and between the multiple first conductor pads provided on the surface (the first surface) on the other side of the wiring substrate. Inspection of presence or absence of a defect in the wiring substrate is more reliably performed.

Obviously, numerous modifications and variations of the present invention are possible in light of the above teachings. It is therefore to be understood that within the scope of the appended claims, the invention may be practiced otherwise than as specifically described herein.

The invention claimed is:

1. A method for manufacturing a wiring substrate, comprising:

preparing a first support plate having a metal foil formed on a surface of a support substrate;

forming a wiring substrate on the metal foil of the first support plate such that the wiring substrate has a first surface facing the metal foil of the first support plate;

attaching a second support plate to a second surface of the wiring substrate on an opposite side with respect to the first surface; and separating the support substrate from the metal foil of the first support plate after the attaching of the second support plate such that the metal foil of the first support plate is removed from the first surface of the wiring substrate and that the first surface of the wiring substrate is exposed, wherein the wiring substrate has a plurality of first conductor pads formed on the first surface, and a plurality of second conductor pads formed on the second surface, the method for manufacturing the wiring substrate includes conducting a first conduction inspection such that conduction between the plurality of second conductor pads is inspected before the attaching of the second support plate to the second surface of the wiring substrate, and conducting a second conduction inspection such that conduction between the plurality of first conductor pads is inspected after the removing of the metal foil from the first surface of the wiring substrate, and the first conduction inspection is conducted in a state in which the first support plate is attached to the first surface, and the second conduction inspection is conducted in a state in which the second support plate is attached to the second surface.

2. The method for manufacturing a wiring substrate according to claim 1, wherein the metal foil of the first support plate includes a first layer and a second layer.

3. The method for manufacturing a wiring substrate according to claim 2, wherein the first conduction inspection includes an open inspection between the plurality of second conductor pads.

4. The method for manufacturing a wiring substrate according to claim 3, wherein the first conduction inspection includes the open inspection between the plurality of second conductor pads that electrically connect to different conductor pads of the first conductor pads via different conductor paths, respectively.

5. The method for manufacturing a wiring substrate according to claim 2, wherein the second conduction inspection includes a short inspection between the plurality of first conductor pads of the wiring substrate.

6. The method for manufacturing a wiring substrate according to claim 5, wherein the second conduction inspection includes the short inspection between the plurality of first conductor pads that are to be electrically separated.

7. The method for manufacturing a wiring substrate according to claim 5, wherein the separating of the support substrate from the metal foil of the first support plate includes separating the first layer from the second layer.

8. The method for manufacturing a wiring substrate according to claim 2, further comprising:

forming a solder resist layer on a surface of the second support plate on an opposite side with respect to the wiring substrate before the second conduction inspection.

9. The method for manufacturing a wiring substrate according to claim 1, wherein the first conduction inspection includes an open inspection between the plurality of second conductor pads.

10. The method for manufacturing a wiring substrate according to claim 9, wherein the first conduction inspection includes the open inspection between the plurality of second conductor pads that electrically connect to different conductor pads of the first conductor pads via different conductor paths, respectively.

11. The method for manufacturing a wiring substrate according to claim 10, wherein the metal foil of the first support plate includes a first layer and a second layer, and the separating of the support substrate from the metal foil of the first support plate includes separating the first layer from the second layer.

12. The method for manufacturing a wiring substrate according to claim 10, further comprising:

forming a solder resist layer on a surface of the second support plate on an opposite side with respect to the wiring substrate before the second conduction inspection.

13. The method for manufacturing a wiring substrate according to claim 9, wherein the second conduction inspection includes a short inspection between the plurality of first conductor pads of the wiring substrate.

14. The method for manufacturing a wiring substrate according to claim 13, wherein the second conduction inspection includes the short inspection between the plurality of first conductor pads that are to be electrically separated.

15. The method for manufacturing a wiring substrate according to claim 9, wherein the metal foil of the first support plate includes a first layer and a second layer, and the separating of the support substrate from the metal foil of the first support plate includes separating the first layer from the second layer.

16. The method for manufacturing a wiring substrate according to claim 9, further comprising:

forming a solder resist layer on a surface of the second support plate on an opposite side with respect to the wiring substrate before the second conduction inspection.

17. The method for manufacturing a wiring substrate according to claim 1, wherein the second conduction inspection includes a short inspection between the plurality of first conductor pads of the wiring substrate.

18. The method for manufacturing a wiring substrate according to claim 17, wherein the second conduction inspection includes the short inspection between the plurality of first conductor pads that are to be electrically separated.

19. The method for manufacturing a wiring substrate according to claim 1, wherein the metal foil of the first support plate includes a first layer and a second layer, and the separating of the support substrate from the metal foil of the first support plate includes separating the first layer from the second layer.

20. The method for manufacturing a wiring substrate according to claim 1, further comprising:

forming a solder resist layer on a surface of the second support plate on an opposite side with respect to the wiring substrate before the second conduction inspection.

* * * * *